US009647121B1

(12) United States Patent
Ito

(10) Patent No.: US 9,647,121 B1
(45) Date of Patent: May 9, 2017

(54) STRUCTURE FOR HCI IMPROVEMENT IN BULK FINFET TECHNOLOGIES

(71) Applicant: Avago Technologies General IP (Singapore) Pte. Ltd., Singapore (SG)

(72) Inventor: Akira Ito, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/087,616

(22) Filed: Mar. 31, 2016

Related U.S. Application Data

(60) Provisional application No. 62/303,932, filed on Mar. 4, 2016.

(51) Int. Cl.
*H01L 29/06* (2006.01)
*H01L 29/78* (2006.01)
*H01L 27/092* (2006.01)

(52) U.S. Cl.
CPC ...... *H01L 29/7851* (2013.01); *H01L 29/0653* (2013.01)

(58) Field of Classification Search
CPC .................. H01L 29/7851; H01L 29/0653
See application file for complete search history.

(56) References Cited

U.S. PATENT DOCUMENTS

| 8,283,727 | B1* | 10/2012 | Walker | H01L 29/0649 257/355 |
| 2012/0049279 | A1* | 3/2012 | Shrivastava | H01L 27/0727 257/347 |
| 2014/0008733 | A1* | 1/2014 | Shrivastava | H01L 21/82380 257/401 |
| 2014/0191315 | A1* | 7/2014 | Ito | H01L 29/66484 257/336 |
| 2015/0076610 | A1* | 3/2015 | Ito | H01L 29/785 257/365 |
| 2016/0093730 | A1* | 3/2016 | Li | H01L 29/7816 257/335 |
| 2016/0181358 | A1* | 6/2016 | Zhang | H01L 29/66689 257/339 |

* cited by examiner

*Primary Examiner* — Christine Enad
(74) *Attorney, Agent, or Firm* — Sterne, Kessler, Goldstein & Fox P.L.L.C.

(57) ABSTRACT

A field effect transistor (FET) is disclosed having one or more fins and providing an increased depletion layer as compared to conventional finFETs. The finFET includes the one or more fins and a substrate formed of a first semiconductor material having a first well region formed of a second semiconductor material, a second well region formed of a third semiconductor material and separated from the first well region by the first semiconductor material, and a deep well region formed of a fourth semiconductor material and disposed below the first well region and the second well region.

20 Claims, 9 Drawing Sheets

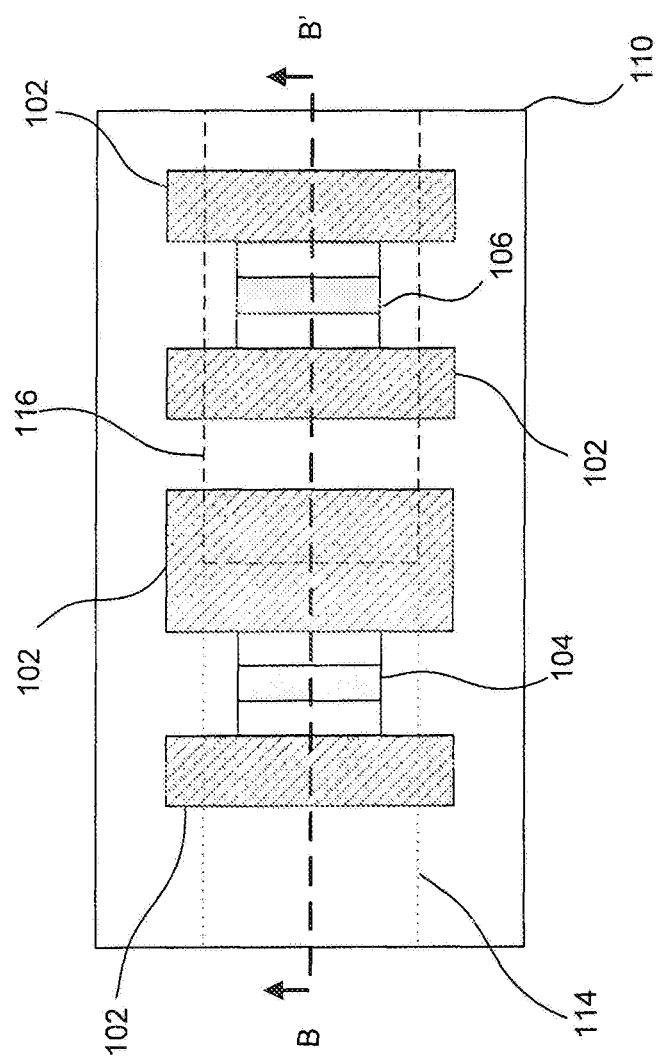
FIG. 1A
(Conventional)

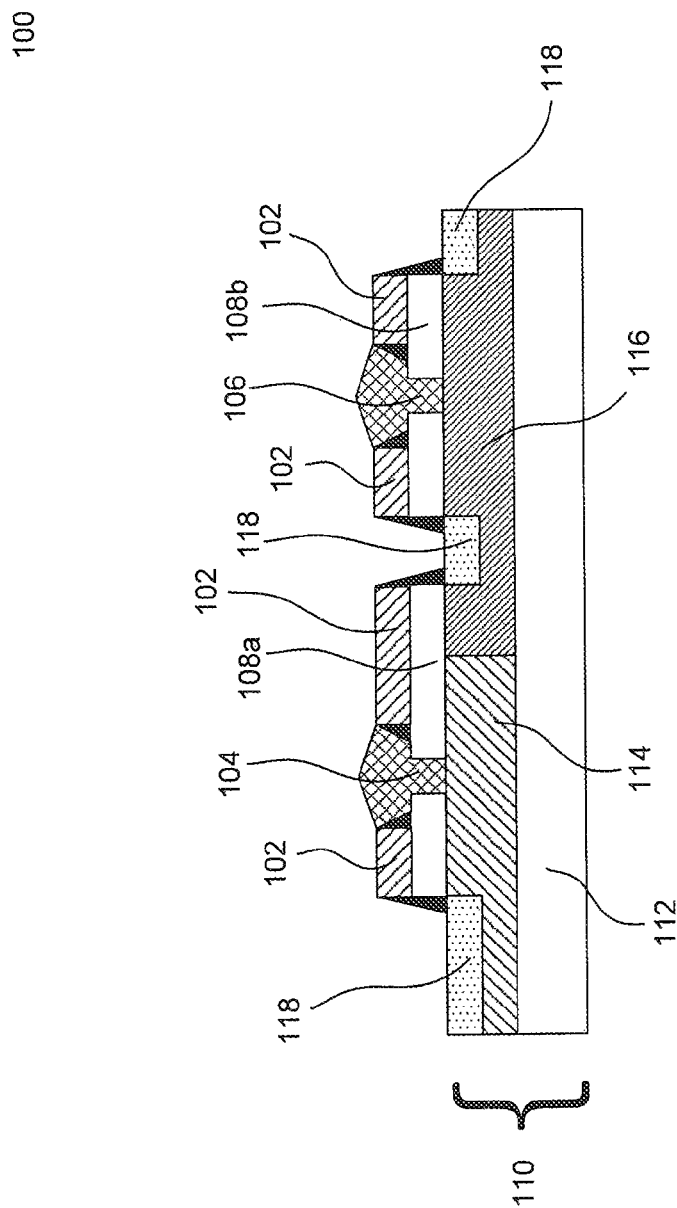
FIG. 1B
(Conventional)

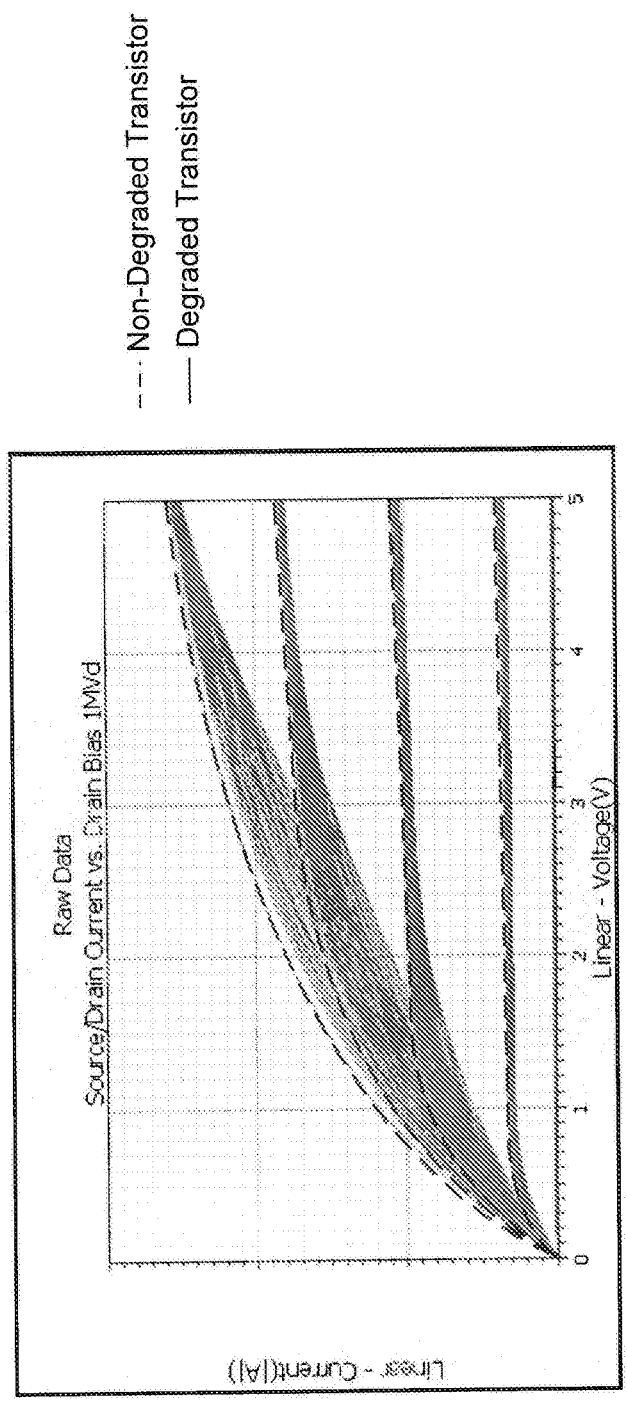
FIG. 1C
(Conventional)

US 9,647,121 B1

STRUCTURE FOR HCI IMPROVEMENT IN BULK FINFET TECHNOLOGIES

CROSS REFERENCE TO RELATED APPLICATIONS

The present application claims the benefit of U.S. Provisional Patent Application No. 62/303,932, filed on Mar. 4, 2016, which is hereby incorporated by reference in its entirety.

FIELD

Embodiments of the present disclosure relate generally to the physical structure of a field effect transistor (FET), including implementing an increased depletion layer using a finFET architecture.

BACKGROUND

Advances in semiconductor manufacturing technologies have resulted in dramatically increased circuit packing densities and higher speeds of operation. In order to achieve such increased densities, a wide variety of evolutionary changes have taken place with respect to semiconductor processing techniques and semiconductor device structures over the years.

The introduction of vertically oriented field effect transistors (FETs), referred to as a finFETs, has more recently been introduced into commercial semiconductor products. Compared to traditional FETs, finFETs provide ways to reduce the overall size of a semiconductor device while retaining the ability to control a conductive channel. However, as with all transistors, finFETs can degrade over time due to hot carrier injection (HCI).

BRIEF DESCRIPTION OF THE DRAWINGS/FIGURES

The accompanying drawings, which are incorporated herein and form a part of the specification, illustrate embodiments of the present disclosure and, together with the description, further serve to explain the principles of the disclosure and to enable a person skilled in the pertinent art to make and use the embodiments.

FIG. 1A is a top-down view of a conventional finFET device.

FIG. 1B is a cross-sectional view of the conventional finFET device of FIG. 1A.

FIG. 1C is an illustration of degradation of conventional finFET devices over time.

The present disclosure will be described with reference to the accompanying drawings. The drawing in which an element first appears is typically indicated by the leftmost digit(s) in the corresponding reference number.

Figure 2A:
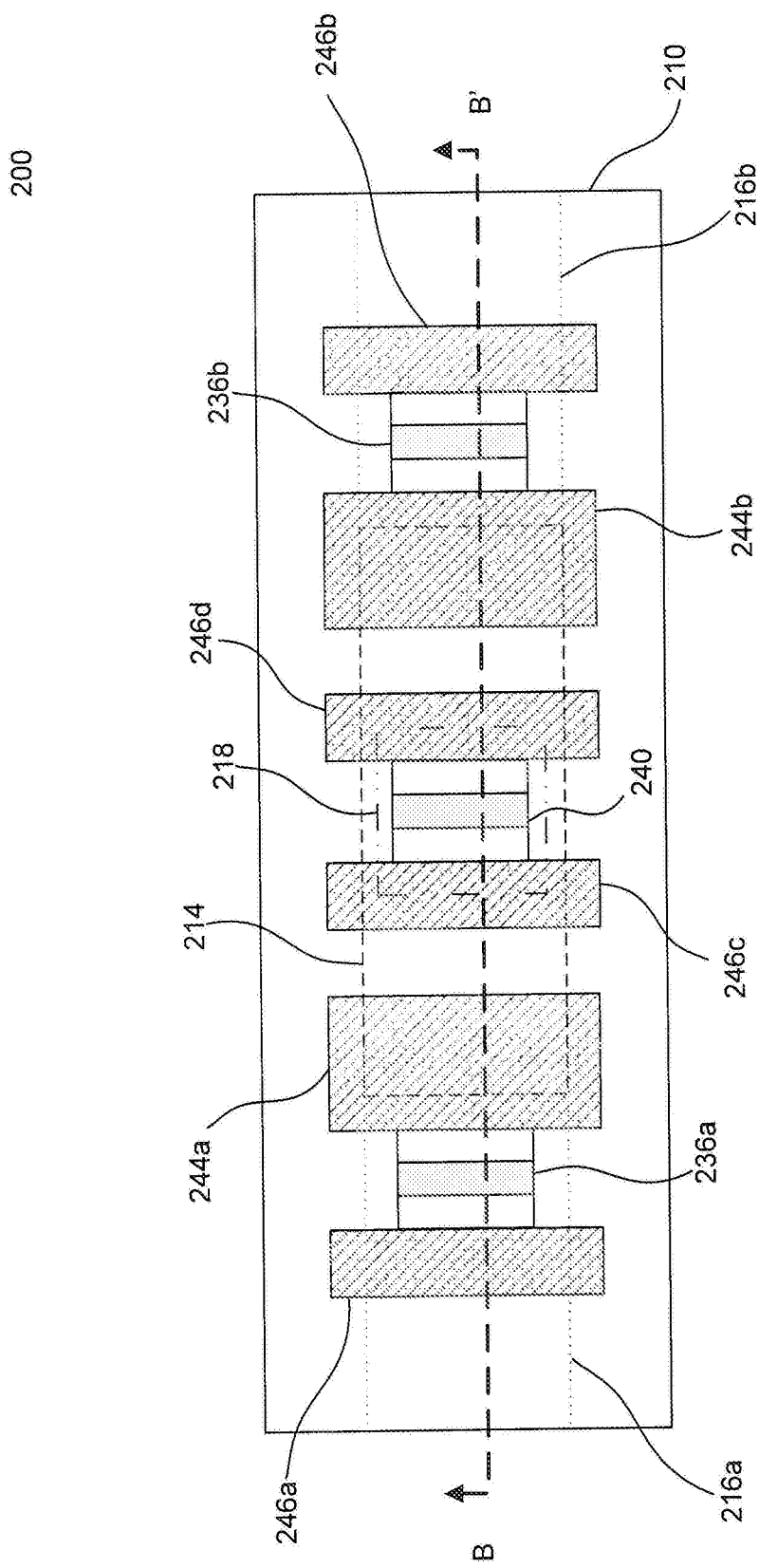
FIG. 2A is a top-down view of a finFET device having an increased depletion layer between source and drain terminals, according to examples of the present disclosure.

It is noted that the drawn representations of various semiconductor structures shown in the figures are not necessarily drawn to scale, but rather, as is the practice in this field, drawn to promote a clear understanding of the structures and process steps which they are illustrating.

DETAILED DESCRIPTION

The following Detailed Description refers to accompanying drawings to illustrate exemplary embodiments. References in the Detailed Description to "one exemplary embodiment," "an illustrative embodiment", "an exemplary embodiment," and so on, indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications may be made to the exemplary embodiments within the spirit and scope of the disclosure.

It is to be understood that the phraseology or terminology herein is for the purpose of description and not of limitation, such that the terminology or phraseology of the present specification is to be interpreted by those skilled in relevant art(s) in light of the teachings herein.

In this case field effect transistor (FET), as discussed herein, includes a metal-oxide-semiconductor FET (MOSFET). An n-channel FET is referred to herein as an NFET. A p-channel FET is referred to herein as a PFET. FETs generally have four terminals, namely gate, drain, source and body.

In general, a finFET device, also known as a three dimensional FET, is a FET having a gate that wraps around a source to drain terminal, as will be described in greater detail throughout the present disclosure. A structure of a conventional finFET device 100 will now be described in view of FIGS. 1A and 1B. It is noted that the structure of the finFET device 100 can be stepped and repeated along the same device by including additional fins, and therefore the finFET device 100 may include multiple conductive channels. However, a description of only a single conductive channel of the finFET device 100 will be described herein for brevity.

FIG. 1A is a top-down view of a conventional finFET device 100. FIG. 1B is a cross-sectional view of the conventional finFET device 100 of FIG. 1A. As shown by FIGS. 1A and 1B, the finFET device 100 includes a plurality of gates 102, a source terminal 104, a drain terminal 106, first and second fins 108a and 108b, and a substrate 110. The plurality of gates 102 are disposed to wrap around the vertical and top sides of the source terminal 104 and drain terminal 106. At least one of the plurality of gates 102 controls the conductivity of the finFET device 100 based on a voltage applied to a gate electrode. The controlling gate(s) 102 includes an insulated gate terminal that includes the gate electrode disposed on top of a gate dielectric.

Though not shown in FIGS. 1A and 1B, typical finFET devices include an oxide layer disposed between a fin and metal electrode to protect the fin. As an example, an oxide layer may be disposed between the plurality of gates 102 and the first fin 108a to prevent a metal electrode structure of the plurality of gates 102 from directly contacting the first fin 108a The source terminal 104 and the drain terminal 106 refer to the terminals of finFET device 100, between which conduction occurs under the influence of an electric field, resulting from the voltage applied to the gate electrode of the finFET device 100. The source terminal 104 and the drain terminal 106 include an electrode disposed on top of a semiconductor material and are fabricated on first and second fins 108a and 108b. Designers often designate a particular source/drain terminal to be a "source" or a "drain" on the basis of the voltage to be applied to the designated terminal when a finFET device is operated in a circuit. However, the designed source and drain can sometimes be swapped.

The first and second fins 108a and 108b are formed such that they extend upwardly away from the substrate 110 thus appearing as "fins" on the substrate 110. The first and second fins 108a and 108b are further fabricated such that they are geometrically symmetrical.

As shown by FIG. 1B, the substrate 110 of the finFET device 100 includes a base region 112, a first well 114, a second well 116, and shallow trench isolation (STI) regions 118. In conventional finFET devices are fabricated by many different methods, the most common of which include silicon on insulator (SOI) flow or bulk flow methods. In an SOI flow, a substrate is separated from the fins by a buried oxide (BOX) layer to fully insulate adjacent fins from each other. In a bulk flow, the fins are formed from the substrate which means that adjacent fins are connected (i.e., not insulated from each other) by way of the substrate. Thus other insulating techniques are required such as oxide insulation between adjacent fins and/or high dose junction implants in the substrate.

The finFET device 100 is formed by a bulk flow method such that the substrate 110 and the fins 108a and 108b are formed of a single silicon material. Accordingly, the base region 112, and the fins 108a and 108b may be formed of the same doped material such as a p-type doped material. Further, the substrate 110 is formed to include the first and second wells 114 and 116 and the STI regions 118 for isolation and protection. The first well 114 may be either a p-type doped region or an n-type doped region formed by implant or diffusion methods. The second well 116 is a doped region that is formed of a different doping type than the first well 114. For example, the first well 114 may be a p-type doped region and the second well 116 may be a n-type doped region. In addition to providing isolation, and as will be explained in further detail below, the first and second wells 114 and 116 are used by the finFET device 100 in creating an electric field when a voltage is applied to the gate electrode of a gate 102.

Degradation of typical finFET devices may occur due to a phenomenon called hot carrier injection (HCI) which occurs when electrons or holes break an interface state (i.e., an interface between a channel and a gate oxide), and become occupied in the gate oxide near a drain region. If a carrier is trapped in the gate oxide, carrier mobility is degraded due to electron-hole pair generation. FIG. 1C is a representation of degradation of typical finFET devices over time. FIG. 1C illustrates non-degraded drain currents of typical finFET devices, as indicated with the dashed lines, and degraded drain currents of the typical finFET devices over time, as indicated by the solid lines. As shown, a drain current for typical finFET devices is degraded over time in the linear region much faster than that of the saturation region due to HCI. Further when typical finFET devices have a low drain to source voltages Vds degradation of the typical finFET devices increases due to an increased amount of HCI.

As a background, when the correct bias voltage is applied to a gate of a field effect transistor (FET), an electric field is created which repels holes, (e.g., in an n-channel FET), or electrons, (e.g., in a p-channel FET) away from the gate into a substrate. The region cleared by the electric field, referred to as the depletion layer, allows a conductive channel to be formed near the surface of the gate. When the correct voltage is then applied between a drain and a source of the FET, current flows through the conductive channel or path due to carriers (electrons or holes) flowing through the depletion layer.

Due to a combination of drain doping profile, FIN doping profile and well doping profile, certain regions of a conductive path between the drain and the source of the FET may show little, if any, voltage change, which means that there is little, if any, depletion occurring at that region of the conductive path. Further other regions of the conductive path may show a significant drop in voltage, which means that a depletion layer exists in that area.

As will be explained in further detail, in view of the exemplary embodiments of this disclosure, by increasing a size of the depletion layer, a finFET device can operate at a higher voltage and reduce hot carrier injection (HCI) related to device degradation.

Exemplary Embodiment

Figure 2B:
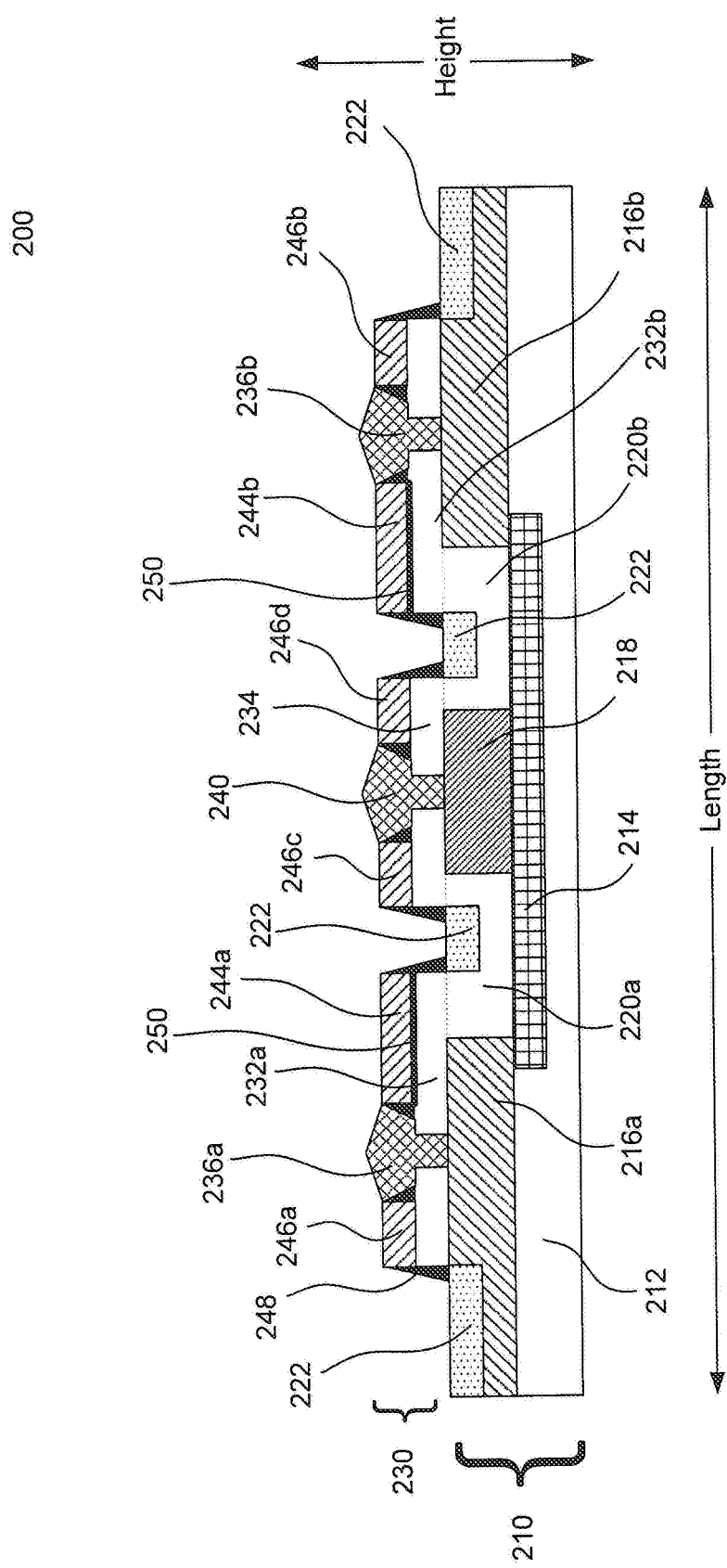
FIG. 2B is a cross-sectional view of the structure of the finFET device of FIG. 2A, according to examples of the present disclosure.

An exemplary embodiment, according to examples of the disclosure will now be discussed in view of FIGS. 2A and 2B. FIG. 2A is a top-down view of a finFET device 200 having an increased depletion layer between source and drain terminals, according to examples of the present disclosure, and FIG. 2B is a cross-sectional view of the structure of the finFET device 200 taken through line B-B'. As shown by FIGS. 2A and 2B, the finFET device 200 is formed by a bulk flow method. Accordingly, first fins 232a and 232b, a second fin 234, and a substrate 210 are formed of the same silicon material. For simplicity, a description of the finFET device 200 will be described as having a substrate 210 and a fin region 230. However, as will be shown below, and as will be understood by those skilled in the arts, some regions and materials of the substrate 210 and the fin region 230 may overlap and/or be the same.

As shown by FIG. 2B, the substrate 210 of the finFET 200 includes a base region 212, a deep well region 214, first well regions 216a and 216b, a second well region 218, separation regions 220a and 220b formed by blocking well implants, and shallow trench isolation (STI) regions 222. The base region 212 forms a base of the finFET device 200. In this exemplary embodiment, the base region 212 is formed of a p-type material such as boron, or other suitable materials, and may have a doping concentration in the range of $5\times10^{14}$ $cm^{-3}$ to $5\times10^{15}$ $cm^{-3}$. However, as will be understood by those skilled in the arts, in other embodiments the base region 212 may be formed of an n-type material if an opposite polarity device is desired.

The deep well region 214 is implanted within a portion of the base region 212. The deep well region 214 extends from the base region 212 and may have a height in the range of 0.08 μm to 0.8 μm. The deep well region 214 may be formed of an n-type material such as phosphorous, or other suitable materials, and may have a doping concentration in the range of $5 \times 10^{16}$ cm$^{-3}$ to $5 \times 10^{17}$ cm$^{-3}$, to provide an example. Accordingly, the deep well region 214 may be referred to a deep n-well region when doped n-type as described. However, as will be understood by those skilled in the arts, in other embodiments the deep well region 214 may be formed of a p-type material, if an opposite polarity device is desired.

The first well regions 216a and 216b are disposed above the base region 212 and the deep well region 214. As shown by FIG. 2B, the first well regions 216a and 216b are configured to contact both the base region 212 and the deep well region 214. The first well regions 216a and 216b can be formed of a p-type material such as boron, or other suitable materials, and may have a doping concentration in the range of $1 \times 10^{17}$ cm$^{-3}$ to $5 \times 10^{18}$ cm$^{-3}$, to provide an example. In other embodiments, as will be described below, the first well regions 216a and 216b may be configured to not contact the deep well region 214. Accordingly, the first well regions 216a and 216b may be referred to as p-well regions when doped p-type as described. However, as will be understood by those skilled in the arts, in other embodiments the first well regions 216a and 216b may be formed of an n-type material if an opposite polarity device is desired.

The second well region 218 is disposed above the base region 212 and the deep well region 214 and configured to contact the deep well region 214. The second well region 218 is formed of a same doping type as the deep well region 214 (e.g., either n-type or p-type) but has a greater doping concentration than the deep well region 214. As an example, the second well region 218 may be doped with an n-type material such as boron and have a doping concentration in the range of $1 \times 10^{17}$ cm$^{-3}$ to $5 \times 10^{18}$ cm$^{-3}$. As will be described in greater detail below, a size of the second well region 218 may be increased or decreased depending on a voltage needs of the finFET device 200. Accordingly, the second well region 218 may be referred to as an n-well region when doped n-type as described.

The separation region 220a is disposed between the first well region 216a and the second well region 218, and the separation region 220b is disposed between the second well region 218 and the first well region 216b. As will be described in further detail below, the separation regions 220a and 220b provide a longer depletion layer between a drain and source of the finFET device 200. In the exemplary embodiment, the separation regions 220a and 220b are formed of a same doping type and material as the base region 212. Accordingly, the separation regions 220a and 220b may be doped with a p-type material such as boron and have a doping concentration in the range of $5 \times 10^{14}$ cm$^{-3}$ to $5 \times 10^{16}$ cm$^{-3}$, to provide an example. It is noted that the doping type for the separation regions 220a and 220b is the same as the first well regions 216a and 216b. However, the doping concentration of the separation regions 220a and 220b is less than a doping concentration of the first well regions 216a and 216b.

The first well regions 216a and 216b, the second well region 218, and the separation regions 220a and 220b extend from the base region 212 and the deep well region 214 and may have a height in the range of 40 nm to 200 nm, to provide an example.

As shown by FIG. 2B, the substrate 210 also includes shallow trench isolation (STI) regions 222. STI regions 222 are dielectric filled recesses disposed on the substrate 210 to provide isolation and protection for the finFET device 200. The STI regions 222 may include a dielectric material such as silicon dioxide, or other suitable material. In the exemplary embodiment, the STI regions 222 are disposed in near-surface portions of the first wells 216a and 216b and the separation regions 220a and 220b. Further, the STI regions 222 may extend from the first well regions 216a and 216b, the second well region 218, and the separation regions 220a and 220b to a height in the range of 40 nm to 100 nm, as an example.

As shown by FIGS. 2A and 2B, the fin region 230 includes first fins 232a and 232b, a second fin 234, source terminals 236a and 236b, a drain terminal 240, active gate terminals 244a and 244b, termination structures 246a-246d, and sidewall spacers 248. As shown by FIG. 2B, the finFET 200 is implemented in a raised source/drain architecture, meaning that the fin region 230 (particularly the source terminals 236a and 236b and the drain terminal 240) is formed above a conductive channel in whole or in part. In this case, the source terminals 236a and 236b and the drain terminal 240 are disposed above and in contact with the substrate 210.

As shown by FIG. 2B, the first fins 232a and 232b are disposed above the substrate 210 and extend upwardly away from the base 212 of the substrate 210. The first fins 232a and 232b are configured to contact the first well regions 216a and 216b, respectively. The first fins 232a and 232b may be formed of a p-type material such as boron, or other suitable materials, and may have a doping concentration in the range of $5 \times 10^{14}$ cm$^{-3}$ to $5 \times 10^{18}$ cm$^{-3}$. However, as will be understood by those skilled in the arts, in other embodiments the first fins 232a and 232b may be formed of an n-type material.

The second fin 234 is disposed above the substrate 210 and extends upwardly away from the base region 212 of the substrate 210. As shown by FIG. 2B, the second fin 234 is configured to contact the second well region 218 and the separation regions 220a and 220b. The second fin 234 may be formed of a p-type material such as boron, or other suitable materials, and may have a doping concentration in the range of $5 \times 10^{14}$ cm$^{-3}$ to $5 \times 10^{18}$ cm$^{-3}$. As will be described in further detail below, in other embodiments, the second fin 234 may be configured to only contact the second well region 218. Further, as will be understood by those skilled in the arts, in other embodiments, the second fin 234 may be formed of an n-type material.

In this exemplary embodiment, the first fins 232a and 232b and the second fin 234 may extend from the substrate 210 to have a height in the range of 25 nm to 80 nm, to provide an example.

The source terminals 236a and 236b are disposed within the first fins 232a and 232b, respectively. The source terminals 236a and 236b includes an electrode configured to receive an electrical signal and a semiconductor material configured to contact the electrode and the first well regions 216a and 216b, respectively. The semiconductor material of the source terminals 236a and 236b may be formed of a semiconductor material with n-type material such as arsenic, and may have a doping concentration in the range of $5 \times 10^{19}$ cm$^{-3}$ to $5 \times 10^{20}$ cm$^{-3}$, to provide an example. In other embodiments, the source terminals 236a and 236b may be formed of a p-type material depending on the type of semiconductor device being implemented. The semiconductor material of the source terminals 236a and 236b can be doped using in-situ doping techniques or can be implant doped epitaxy, where epitaxy refers to a layer of single crystal semiconductor material.

The drain terminal 240 is disposed within the second fin 234. The drain terminal 240 includes an electrode configured to receive an electrical signal and a semiconductor material configured to contact the electrode and the second well region 218. The semiconductor material of the drain terminal 240 may be formed of the same doping type and have the same doping concentration as the source terminals 236a and 236b. The semiconductor material of the drain terminal 240 may be doped using in-situ doping techniques or can be implant doped epitaxy.

As shown by FIGS. 2A and 2B, the active gate terminals 244a and 244b are disposed to wrap around the vertical and top sides of the first fins 232a and 232b, respectively. The active gate terminals 244a and 244b may be formed of an electrode material to receive an electric signal. Further, active gate terminals 244a and 244b may provide a barrier for containing epitaxial growth and isolate the source terminals 236a and 236b, respectively, to desired areas of the finFET 200.

The termination structures 246a and 246b are disposed to wrap around the vertical and top sides of the first fins 232a and 232b, respectively, and the termination structures 246c and 246d are configured to wrap around the vertical and top sides of the second fin 234. The termination structures 246a and 246b may provide a barrier for epitaxial growth and isolate the source terminals 236a and 236b, respectively, to desired areas of the finFET 200. Similarly, the termination structures 246c and 246d provide a barrier for epitaxial growth and isolate the drain terminal 240 to desired areas of the finFET 200.

During fabrication of the finFET device 200, the termination structures 246a-246d may be formed of a dielectric material and/or an electrode material. The termination structures 246a-246d may remain in place as final termination structures of the finFET device 200, or may be removed and replaced with alternative dielectric or electrode materials. Gate replacement processes such as high-k, metal gate (HKMG) are well-known in the semiconductor manufacturing field and are not described herein. As described above, the termination structures 246a-246d may be formed of the same structure and materials and may perform similar functions as the active gate terminals 244a and 244b. However, the termination structures 246a-246d are electrically isolated (i.e., not connected to an electrical signal) and therefore do not control the conductivity of a conductive channel from a source to drain. Therefore the termination structures are typically referred to as "dummy gates" or "sacrificial gates."

When formed, the active gate terminals 244a and 244b and the termination structures 246a-246d may extend from the first fins 232a and 232b and the second fins 234 to a height in the range of 25 nm to 80 nm.

Embodiments of the present disclosure also include an oxide layer 250 to protect and isolate the gate structure from the fins. As shown, the oxide layer 250 is disposed between the active gate terminal 244a and the first fin 232a to prevent a metal electrode structure of the active gate terminal 244a from directly contacting the first fin 232a. The oxide layer 250 is also disposed to prevent contact between the active gate terminal 244b and the first fin 232b. Though not shown, an oxide layer(s) may also be disposed between termination structures 246a-246d and fins as needed. Furthermore, in an embodiment, the oxide layer may also be disposed at both ends (sidewalls) of 232a, 234 and 232b. Though not shown, fins may be pulled back slightly and a part of 246a-246d, 244a and 244b are disposed to abut adjacent sidewalls covered by the gate insulator.

The side wall spacers 248 are disposed to abut adjacent sidewalls of the active gate terminals 244a and 244B and the termination structures 246a-246d. The sidewall spacers 248 may be formed of a dielectric material, such as silicon dioxide, though any suitable material can be used.

As shown by FIGS. 2A and 2B, the finFET device 200 is a single finFET device that includes separate, co-linear fins, (e.g., the first fin 232 and the second fin 234) disposed on the substrate 210. As illustrated, this embodiment can be stepped and repeated along the same device by including additional fins (e.g., the third fin 236) such that there are multiple conductive channels on a single finFET device, where each conductive channel has a source and a drain. In the exemplary embodiment, the finFET device 200 includes two conductive channels, one between the source terminal 236a and the drain terminal 240, and another between the source terminal 236b and the drain terminal 240. However, as will be understood by those skilled in the arts, in other embodiments one or more conductive channels may be included in a finFET device.

Operation of the Exemplary Embodiment

Figure 2C:
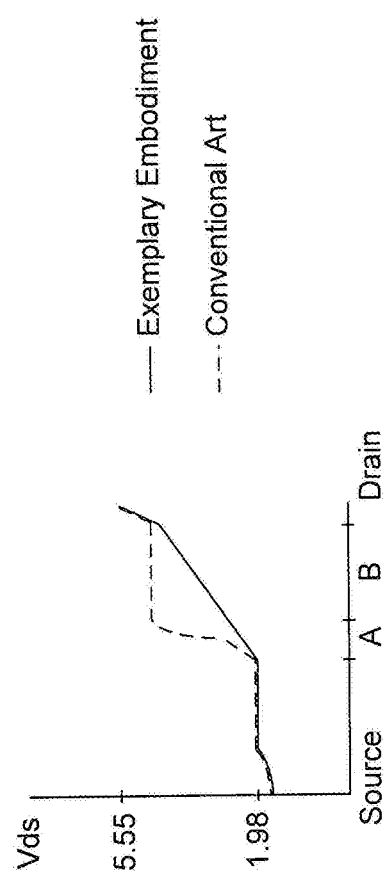
FIG. 2C is an illustration of a drain to source voltage for the finFET device of FIGS. 2A and 2B, according to an example of the present disclosure.

An operation of a conductive channel formed between the source terminal 236a and the drain terminal 240 will now be described in view of FIGS. 2A-2C. FIG. 2C is an illustration of a drain to source voltage for the finFET device 200 illustrated in FIGS. 2A and 2B, according to an example of the disclosure. It is noted that the following description of the operation is in reference to the doping concentrations provided as examples throughout the disclosure. Specifically, the following example is for the operation of the finFET device 200 when: the deep well region 214 and the second well region 218 are doped n-type with phosphorous, and have doping concentrations in the range of $5\times10^{16}$ cm$^{-3}$ to $5\times10^{17}$ cm$^{-3}$ and $1\times10^{17}$ cm$^{-3}$ to $5\times10^{18}$ cm$^{-3}$, respectively; the first well region 216a is doped p-type with boron, having a doping concentration in the range of $1\times10^{17}$ cm$^{-3}$ to $5\times10^{18}$ cm$^{-3}$, and the separation region 220a and the first and second fins 232a and 234 are doped p-type with boron having a doping concentration in the range of $5\times10^{14}$ cm$^{-3}$ to $5\times10^{18}$ cm$^{-3}$.

When the active gate terminal 244a receives a gate bias voltage, an electric field is formed below the active gate terminal 244a and a depletion layer is formed. With proper drain to source bias, conduction channels will be formed between the proximal edges of source structures 236 and the drain structure 240. For example, a first conduction channel between source structure 236a and drain structure 240 includes the first fin portion 232a, the separation region 220a under the STI region 222, and the second fin portion 234. Likewise, a second conduction channel is formed between the source structure 236b and the drain structure 240.

Based on the above-described configuration of the second well region 218, the separation region 220a, and the first well region 216a, a length of the depletion layer has been increased compared to typical finFET devices. More specifically, the light doping concentrations of the separation region 220a and the deep well region 214 enable electrons from first fin 232a to the separation regions 220a to take a longer path, away from STI regions 222, and a part of deep well region 214 may act as the drain. Further, due to the light doping of both of the p-type separation region 220a and the n-type deep well region 214, the electric field is substantially decreased, as compared to typical finFET devices, which suppresses electron-hole pair generation to decrease a probability of interface state generation, and lower carrier scattering. This, is turn, improves device reliability and longevity.

As shown by FIG. 2C, a drain to source voltage Vds of the finFET device 200 is able to more uniformly drop between a high voltage (e.g., 5.5 volts) and a voltage threshold Vth, as indicated by the solid line of FIG. 2C, in comparison to the drain to source voltage Vds of a typical finFET device, as indicated by the dashed lines of FIG. 2C.

A conductive channel between source terminal 236b and the drain terminal 240 is formed similar to the conductive channel formed between the source terminal 236a and the drain terminal 240, as described above.

Additional Exemplary Embodiments

Figure 3:
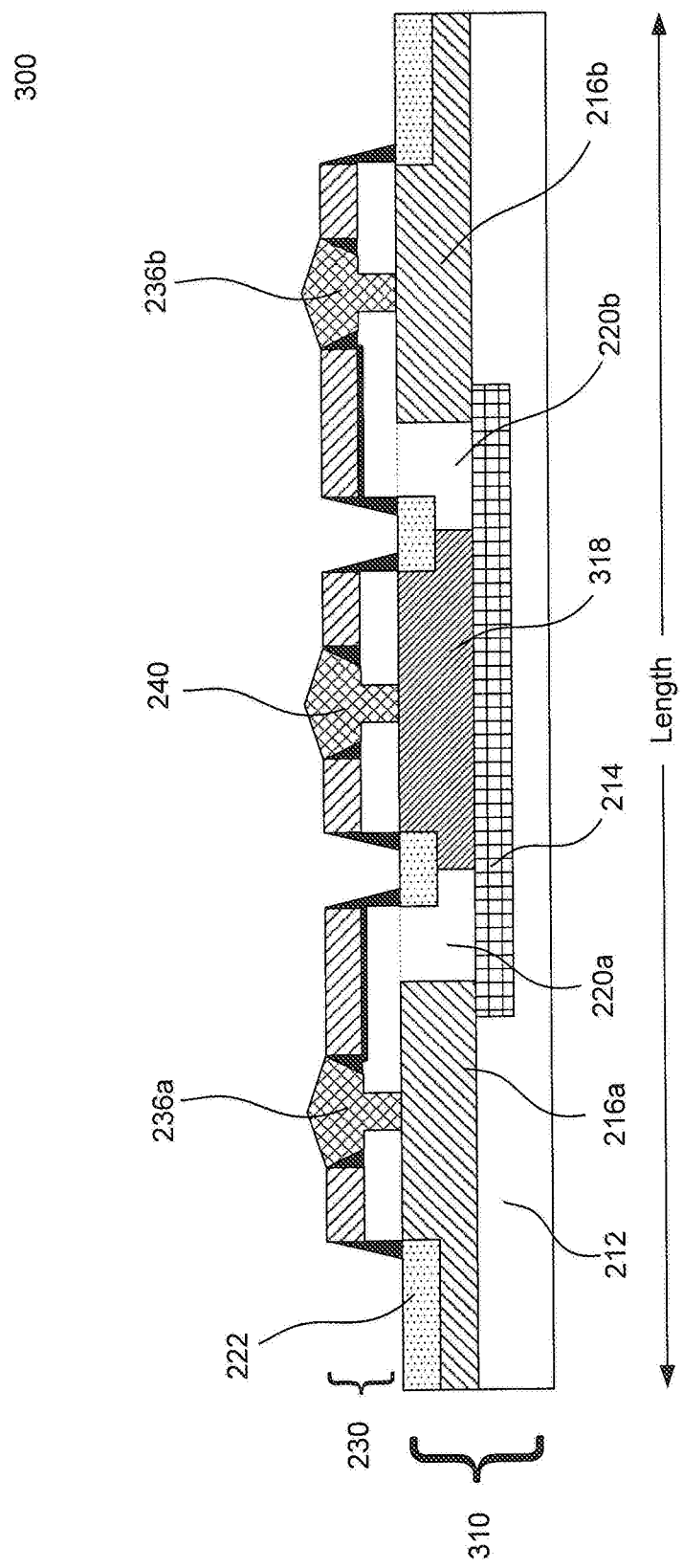
FIG. 3 is a cross-sectional view of a finFET device having an increased depletion layer between source and drain terminals, according to examples of the present disclosure.

FIG. 3 is a cross-sectional view of a finFET device having an increased depletion layer between source and drain terminals, according to examples of the present disclosure. FinFET device 300 includes structure that is similar to the finFET device 200 but includes a substrate 310 having a second well region 318 with an increased length compared to that of finFET device 200. In particular, the second well region 318 extends below the STI regions 222. By increasing a length of the second well region 318, a current between the drain terminal 240 and the source terminal 236a increases which causes the drain to source voltage Vds to decrease.

Figure 4:
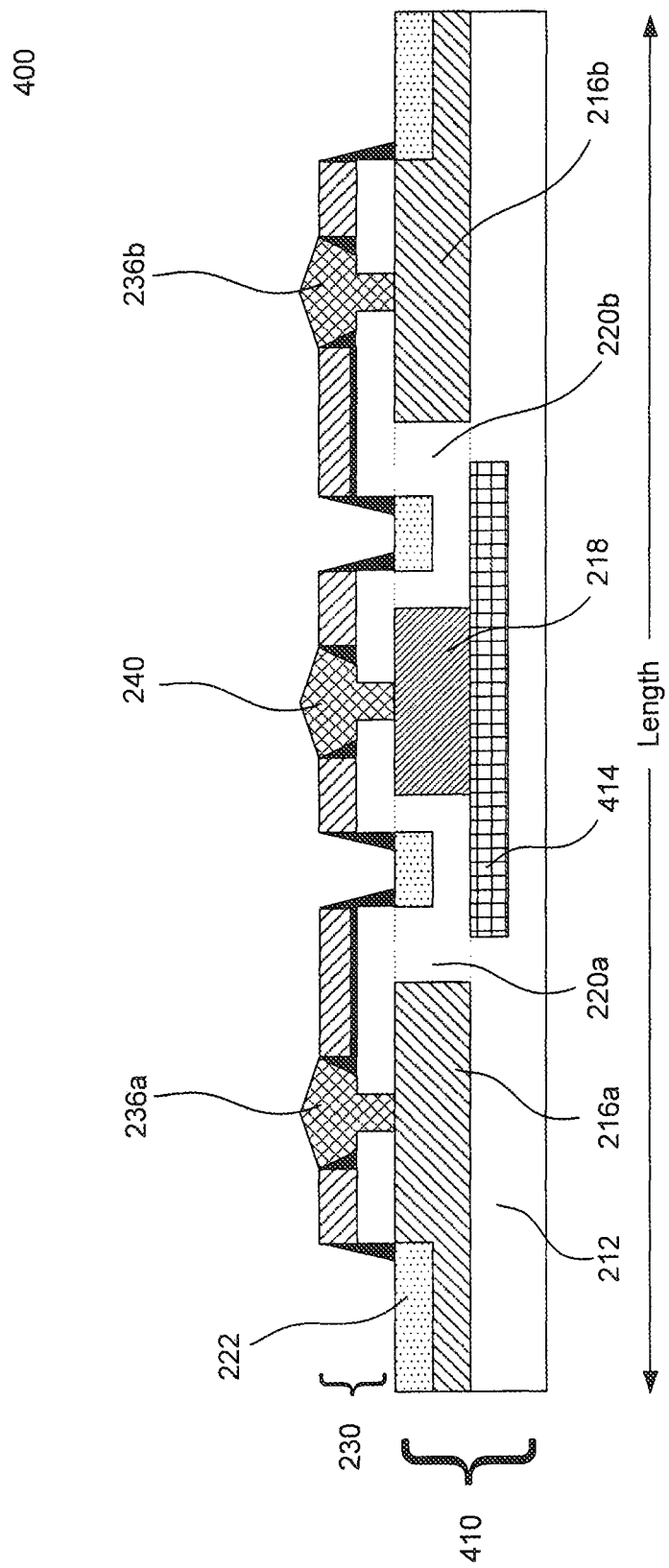
FIG. 4 is a cross-sectional view of a finFET device having an increased depletion layer between source and drain terminals, according to examples of the present disclosure.

FIG. 4 is a cross-sectional view of a finFET device having an increased depletion layer between source and drain terminals, according to examples of the present disclosure. FinFET device 400 includes structure that is similar to the finFET devices 200, 300 but includes a substrate 410 having a deep well region 414 with a decreased length compared to that of finFET 200. As shown, the deep well region 414 extends only part way below the separation regions 220a and 220b.

Figure 5:
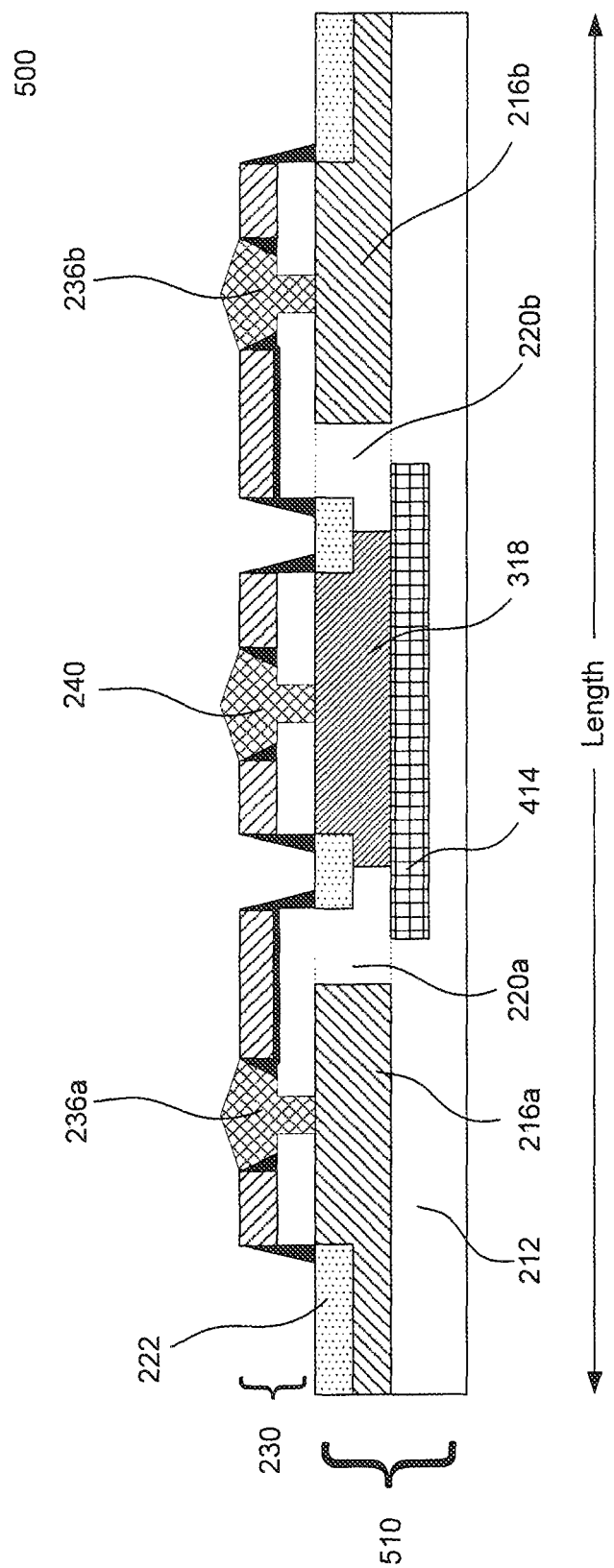
FIG. 5 is a cross-sectional view of a finFET device having an increased depletion layer between source and drain terminals, according to examples of the present disclosure.

FIG. 5 is a cross-sectional view of another embodiment of a finFET having an increased depletion layer between source and drain terminals, according to examples of the disclosure. As shown, finFET 500 includes structure that is similar to the finFETs 200, 300, 400 but includes a substrate 510 having the second well region 318 of FIG. 3, as discussed above, and the deep well region 414 of FIG. 4, as discussed above. According to the configuration of finFET 500 both benefits of the finFET 300 and finFET 400 may be achieved.

Furthermore, the embodiments of FIGS. 2A-2B and FIGS. 3-5 have been described with a particular relative arrangement of n-type and p-type doping for the various regions of the substrate 210 in the finFET 200. For instance, base region 212, first well regions 216, and separation regions 220 have been described as having p-type doping, and the second well region 218 and deep well region 214 have been described as having n-type doping. As a result, the voltage drop from drain to source is more uniformly distributed as shown in FIG. 2C.

As will be understood by those skilled in the arts, n-type doping and p-type doping are of opposite polarities, because n-type doping causes an excess of electrons as carriers, and p-type doping causes an excess of holes as carriers in their particular regions.

Further, as will be understood by those skilled in the art, the n-type and p-type doping can be swapped for the particular regions of the substrate 210 in the finFET 200 to create a device having an opposite polarity. More specifically, base region 212, first well regions 216, and separation regions 220 can be doped to have n-type doping, when the second well region 218 and deep well region 214 are doped with p-type doping.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The foregoing disclosure outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (finFET), comprising:
   a substrate;
   a first fin disposed on the substrate, the first fin supporting a gate terminal and a source structure; and
   a second fin disposed on the substrate and laterally displaced from the first fin, the second fin supporting a drain structure;
   wherein the substrate includes:
      a first well region forming beneath the source structure and having a first type doping;
      a second well region formed beneath the drain structure and having a second type doping;
      a first separation region disposed laterally between the first well region and the second well region, the first separation region having the first type doping; and
      a deep well region disposed beneath, and in contact with, the second well region and a portion of the first separation region, wherein a top surface of the deep well region is in contact with respective bottom surfaces of the second well region and the first separation region,
   wherein the deep well region has the second type doping, and wherein the second type doping is opposite in polarity of the first type doping.

2. The finFET of claim 1, wherein the first type doping is p-type doping, and the second type doping is n-type doping.

3. The finFET of claim 1, wherein the first type doping is n-type doping, and the second type doping is p-type doping.

4. The finFET of claim 1, wherein a doping concentration of the second well region is greater than a doping concentration of the deep well region, and wherein a doping concentration of the first well region is greater than a doping concentration of the first separation region.

5. The finFET of claim 1, wherein doping concentrations of the first separation region and the deep well region are lightly doped compared with respective doping concentrations of the first well region and the second well region.

6. The finFET of claim 1, further comprising a shallow trench isolation (STI) region disposed in the first separation region.

7. The finFET of claim 6, wherein the gate terminal is configured to receive an active gate bias voltage that causes a formation of a conduction channel that extends from an edge of the source structure to an edge of the drain structure, wherein the conduction channel includes a portion of the first fin, the first separation region under the STI region, and a portion of the second fin.

8. The finFET of claim 7, wherein a depletion layer of the finFET is elongated causing carriers in the conduction channel to take a longer path away from the STI region so as to reduce an electric field experienced by the carriers.

9. The finFET of claim 6, wherein the second well region extends beneath an entire length of the second fin and beneath a portion of the STI region.

10. The finFET of claim 6, wherein the second well region extends beneath a portion of the second fin and does not overlap with the STI region.

11. The finFET of claim 1, further comprising:
a third fin disposed on the substrate and laterally displaced from the second fin, the third fin supporting a second source structure,
wherein the substrate further includes:
a third well region formed beneath the second source structure, the third well region having the first doping type;
a second separation region disposed laterally between the second well region and the third well region, the second separation region having the first doping type, and
wherein the deep well region is disposed beneath and in contact with a portion of the second separation region.

12. The finFET of claim 11, wherein the deep well region is disposed beneath and in contact with all of the first separation region and the second separation region, a portion of the first well region, and a portion of the third well region.

13. The finFET of claim 11, further comprising a first shallow trench isolation (STI) region disposed in the first separation region, and a second STI region disposed in the second separation region.

14. The finFET of claim 13, wherein the second well region extends beneath an entire length of the second fin, beneath a portion of the first STI region, and beneath a portion of the second STI region.

15. A fin field effect transistor (finFET), comprising:
a substrate;
a first fin disposed on the substrate, the first fin supporting a gate terminal and a source structure; and
a second fin disposed on the substrate and laterally displaced from the first fin, the second fin supporting a drain structure;
wherein the substrate includes:
a first well region formed beneath the source structure and having a first type doping;
a second well region formed beneath the drain structure and having a second type doping;
a first separation region disposed laterally between the first well region and the second well region, the first separation region having the first type doping, and including a shallow trench isolation (STI) region disposed in the first separation region; and
a deep well region disposed beneath, and in contact with, the second well region, all of the first separation region, and a portion of the first well region,
wherein the deep well region has the second type doping that is opposite in polarity of the first type doping.

16. The finFET of claim 15, wherein the second well region extends beneath an entire length of the second fin and beneath a portion of the STI region.

17. A fin field effect transistor (finFET), comprising:
a substrate;
a first fin disposed on the substrate, the first fin supporting a gate terminal and a source structure; and
a second fin disposed on the substrate and laterally displaced from the first fin, the second fin supporting a drain structure;
wherein the substrate includes:
a p-well region formed beneath the source structure;
an n-well region formed beneath the drain structure;
a separation region disposed laterally between the p-well region and the n-well region, wherein the separation region is doped p-type; and
a deep n-well region disposed beneath, and in contact with, the n-well region and a portion of the separation region, wherein a top surface of the deep n-well region is in contact with respective bottom surfaces of the n-well region and the separation region,
wherein a doping concentration of the n-well region is greater than a doping concentration of the deep n-well region, and wherein a doping concentration of the p-well region is greater than a doping concentration of the separation region.

18. The finFET of claim 17, wherein the deep n-well region is disposed beneath and in contact with the n-well region, all of the separation region, and a portion of the p-well region.

19. A fin field effect transistor (finFET), comprising:
a substrate;
a first fin disposed on the substrate, the first fin supporting a gate terminal and a source structure; and
a second fin disposed on the substrate and laterally displaced from the first fin, the second fin supporting a drain structure;
wherein the substrate includes:
an n-well region formed beneath the source structure;
a p-well region formed beneath the drain structure;
a separation region disposed laterally between the n-well region and the p-well region, wherein the separation region is doped n-type; and
a deep p-well region disposed beneath, and in contact with, the p-well region and a portion of the separation region, wherein a top surface of the deep p-well region is in contact with respective bottom surfaces of the p-well region and the separation region,
wherein a doping concentration of the p-well region is greater than a doping concentration of the deep p-well region, and wherein a doping concentration of the n-well region is greater than a doping concentration of the separation region.

20. The finFET of claim 19, wherein the deep p-well region is disposed beneath and in contact with the p-well region, all of the separation region, and a portion of the n-well region.

* * * * *